(12) United States Patent
Zhou

(10) Patent No.: US 10,768,735 B2
(45) Date of Patent: Sep. 8, 2020

(54) ORGANIC LIGHT EMITTING DIODE TOUCH PANEL AND METHOD OF FORMING THE SAME

(71) Applicant: WUHAN CHINA STAR OPTOELECTRONICS SEMICONDUCTOR DISPLAY TECHNOLOGY CO., LTD., Wuhan, Hubei (CN)

(72) Inventor: Hongyu Zhou, Hubei (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 0 days.

(21) Appl. No.: 16/308,653

(22) PCT Filed: Nov. 16, 2018

(86) PCT No.: PCT/CN2018/115846
§ 371 (c)(1),
(2) Date: Dec. 10, 2018

(87) PCT Pub. No.: WO2020/052057
PCT Pub. Date: Mar. 19, 2020

(65) Prior Publication Data
US 2020/0081569 A1 Mar. 12, 2020

(30) Foreign Application Priority Data
Sep. 12, 2018 (CN) .......................... 2018 1 1060085

(51) Int. Cl.
*G06F 3/041* (2006.01)
*G06F 3/044* (2006.01)
*H01L 27/32* (2006.01)
*H01L 51/52* (2006.01)
*H01L 51/56* (2006.01)

(52) U.S. Cl.
CPC .......... *G06F 3/0412* (2013.01); *G06F 3/0445* (2019.05); *G06F 3/0446* (2019.05); *H01L 27/323* (2013.01); *H01L 27/3244* (2013.01); *H01L 51/5253* (2013.01); *H01L 51/56* (2013.01); *G06F 2203/04103* (2013.01); *G06F 2203/04111* (2013.01); *G06F 2203/04112* (2013.01)

(58) Field of Classification Search
CPC .................. G06F 3/0412; G06F 3/044; G06F 2203/04103; G06F 2203/04102; G06F 2203/04112; G06F 2203/04111
See application file for complete search history.

(56) References Cited

U.S. PATENT DOCUMENTS

2018/0204886 A1* 7/2018 Lee .................. G06F 3/0412

FOREIGN PATENT DOCUMENTS

CN 206322134 U * 7/2017

* cited by examiner

*Primary Examiner* — Xuemei Zheng
(74) *Attorney, Agent, or Firm* — Muncy, Geissler, Olds & Lowe, P.C.

(57) ABSTRACT

An OLED touch panel includes an OLED structure, a first conductive layer, a second conductive layer comprising first sensing electrodes, a sensing conductive layer, a third conductive layer comprising second driving electrodes and second sensing electrodes. The first driving electrodes are electrically connected to the plurality of second driving electrodes. The second sensing electrodes overlap the plurality of first sensing electrodes one-on-one.

12 Claims, 9 Drawing Sheets

ORGANIC LIGHT EMITTING DIODE TOUCH PANEL AND METHOD OF FORMING THE SAME

BACKGROUND

1. Field of the Disclosure

The present disclosure relates to the field of capacitive sensing technology, and more particularly, to a mutual capacitive organic light-emitting diode (OLED) touch panel and a method of forming the OLED touch panel.

2. Description of the Related Art

Organic light-emitting diode (OLED) touch panels are gradually and widely used in mobile terminals owing to their flexibility, color, and touch accuracy. Touch technology is divided into on-cell technology and in-cell technology. The so-called on-cell technology, a touch electrode is directly formed on a thin film encapsulating layer of the OLED. However, based on the on-cell technology, the capacitive sensing components which are directly formed on an OLED panel may be affected by an OLED cathode, causing driving signals to be disturbed so that the amount of sensing capacitance before and after a user touches the OLED panel varies to a smaller amount, thereby making the touch chip difficult to monitor. In another aspect, the current capacitive sensing component includes a plurality of transparent first conductive layers and a plurality of second conductive layer. The plurality of first conductive layers and the plurality of second conductive layers overlap horizontally and vertically. Each of the plurality of first conductive layers includes a plurality of first sensing electrodes. Each of the plurality of second conductive layers includes a plurality of second sensing electrodes. A bridge plan is adopted for the traverse of the second conductive layer and the first conductive layer. But, because the area of the bridge connection is smaller, the contact resistance is larger, resulting in an increase in power consumption.

SUMMARY

Therefore, an object of the present disclosure is to propose a mutual capacitive organic light emitting diode (OLED) touch panel and a method of forming the OLED touch panel. In other words, a mutual capacitive touch panel and an OLED panel are integrated. The utility model can effectively reduce the interference of the OLED cathode on driving signals, improve the touch precision, and reduce the resistance at the bridge. Accordingly, the above-mentioned technical problems of the related art are successfully solved.

According to a first aspect of the present disclosure, an organic light-emitting diode (OLED) touch panel comprises: a substrate; an OLED structure, arranged on the substrate; an encapsulating layer, arranged on the OLED structure; wherein the OLED touch panel further comprises: a first conductive layer, arranged on the encapsulating layer, and comprising a plurality of first driving electrodes; a second conductive layer, arranged on the encapsulating layer, and comprising a plurality of first sensing electrodes; an insulating layer, covering the first conductive layer and configured to separate the first conductive layer from the second conductive layer; a sensing conductive layer, arranged on the insulating layer and contacting the plurality of first sensing electrodes; a third conductive layer, comprising a plurality of second driving electrodes, wherein the plurality of first driving electrodes are electrically connected to the plurality of second driving electrodes; and a plurality of second sensing electrodes, arranged on the sensing conductive layer; the plurality of second sensing electrodes overlapping the plurality of first sensing electrodes one-on-one.

Optionally, the first conductive material is indium tin oxide or indium zinc oxide or silver nanowires (AgNW).

Optionally, the plurality of second sensing electrodes and the third conductive layer are simultaneously formed by a second conductive material.

Optionally, the second conductive material is a metal mesh.

Optionally, the OLED touch panel further comprises an isolating layer; the isolating layer is arranged on the sensing conductive layer and covers the first conductive layer; the isolating layer overlaps the insulating layer.

Optionally, the third conductive layer further comprises a second driving line adjacent to the second driving electrodes.

Optionally, the OLED touch panel further comprises a plurality of third driving electrodes; the plurality of third driving electrodes and the sensing conductive layer are simultaneously formed by the same conductive material; the plurality of third driving electrodes are not connected to each other nor to the sensing conductive layer.

According to a second aspect of the present disclosure, a method of forming an organic light-emitting diode (OLED) touch panel comprises: forming an OLED structure on a substrate, the OLED structure comprising an anode, a cathode, and an OLED layer; arranging the OLED layer between the anode and the cathode; forming an encapsulating layer on the OLED structure; forming a first conductive layer and a second conductive layer on the encapsulating layer; the first conductive layer comprising a plurality of first driving electrodes; the second conductive layer comprising a plurality of first sensing electrodes; forming an insulating layer to cover the first conductive layer; the insulating layer configured to separate the first conductive layer from the second conductive layer; forming a sensing conductive layer on the insulating layer; the sensing conductive layer contacting the plurality of first sensing electrodes; forming a third conductive layer and a plurality of second sensing electrodes on the sensing conductive layer, wherein the third conductive layer comprises a plurality of second driving electrodes; the plurality of first driving electrodes are electrically connected to the plurality of second driving electrode; the plurality of second sensing electrodes overlap the plurality of first sensing electrodes one-on-one.

Optionally, the block comprises a block of forming an isolating layer on the sensing conductive layer such that the isolating layer covers the first conductive layer; the third conductive layer and the sensing conductive layer are separated by the isolating layer.

Optionally, the block of forming the sensing conductive layer on the insulating layer comprises: forming the sensing conductive layer and a plurality of third driving electrodes on the insulating layer simultaneously; forming the plurality of third driving electrodes and the sensing conductive layer simultaneously with the same conductive material; the plurality of third driving electrodes being not connected to each other nor to the sensing conductive layer.

Optionally, the first conductive material is indium tin oxide or indium zinc oxide or silver nanowires (AgNW).

Optionally, the plurality of second sensing electrodes and the third conductive layer are simultaneously formed by a second conductive material.

Optionally the second conductive material is a metal mesh.

Compared with the related art, in the present disclosure, a mutual capacitive touch panel and an OLED panel are integrated to form an OLED touch panel. Since the third conductive layer and the first conductive layer overlap and are electrically connected to each other, the third conductive layer and the first conductive layer have the same potential. Because the electric field exerts influence among the first conductive layers, the driving signals transmitted through the third conductive layer can be effectively reduced by the OLED cathode, thereby increasing the mutual capacitance between the third conductive layer and the plurality of second sensing electrodes and improving touch accuracy. In addition, a sensing conductive layer overlaps and directly contacts the plurality of first sensing electrodes, so the area of the sensing conductive layer and the area of the plurality of first sensing electrodes are larger, resulting in a smaller resistance as well as a smaller power consumption.

These and other features, aspects and advantages of the present disclosure will become understood with reference to the following description, appended claims and accompanying figures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 9A-10A illustrate the process of forming a touch panel from a top view according to a second embodiment of the present disclosure.

FIGS. 9B-10B illustrate the process of forming the touch panel proposed by the second embodiment along a profile line C-C' as shown in FIGS. 9A-10A, respectively.

DETAILED DESCRIPTION OF THE EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
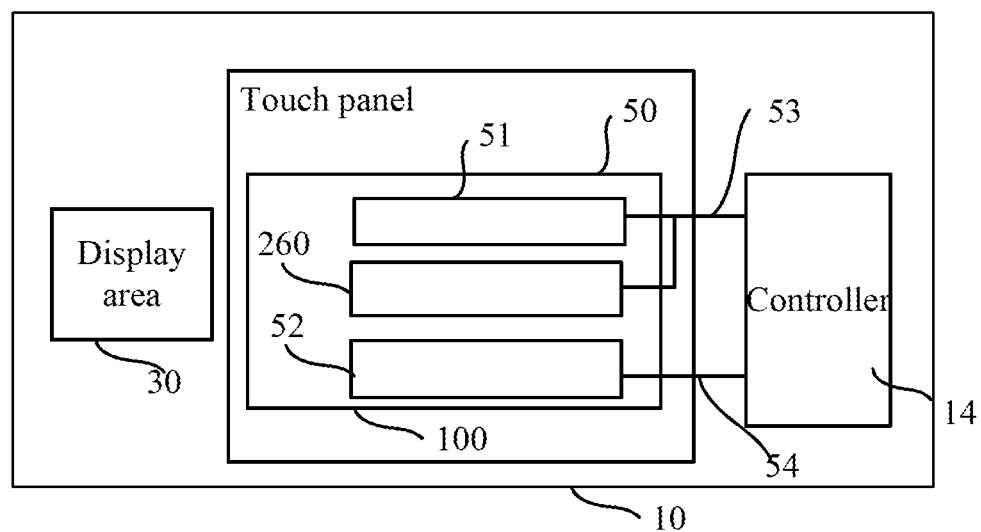
FIG. 1 is a schematic diagram of a display device according to a first embodiment of the present disclosure.
Figure 2:
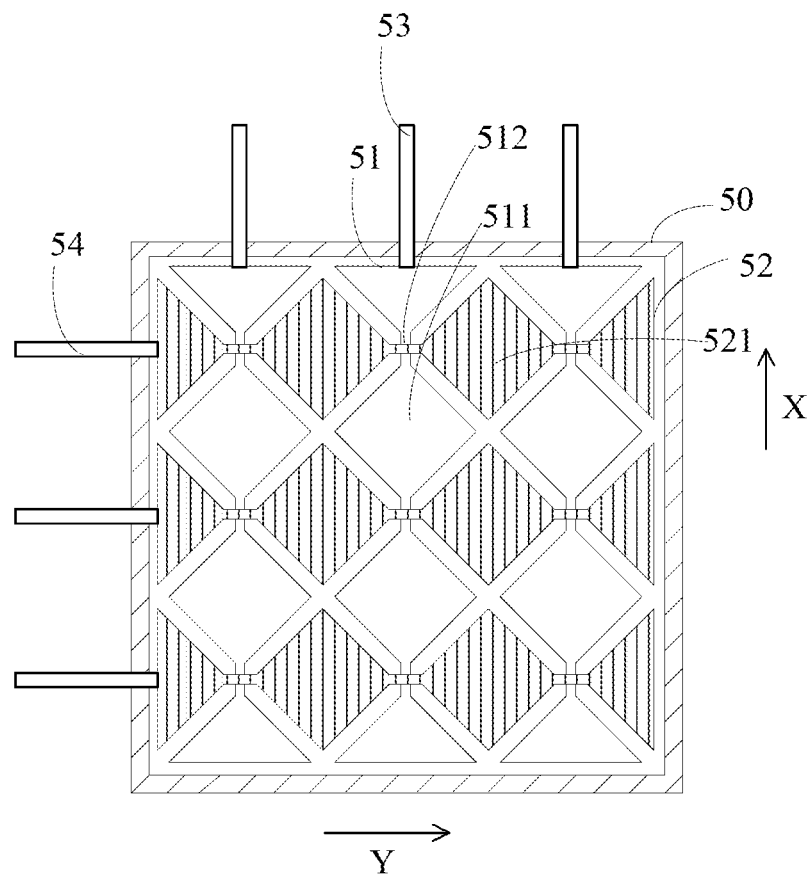
FIG. 2 is a schematic diagram illustrating the partial structural of a touch zone of a touch panel of the present embodiment.

Please refer FIG. 1 and FIG. 2. FIG. 1 is a schematic diagram of a display device 10 according to a first embodiment of the present disclosure. FIG. 2 is a schematic diagram illustrating the partial structural of a touch zone 50 of a touch panel of the present embodiment. The display device 10 includes a display zone 30, a touch panel 100, and a controller 14. The touch panel 100 is an organic light emitting diode (OLED) display panel with a touch function. The display zone 30 is configured to display images. The touch zone 50 is configured to detect the position of user's finger touching the panel. A plurality of pixels arranged in a matrix are arranged on the display zone 30. Each of the plurality of pixels includes three OLEDs of three primary colors, that is, red (R), green (G), and blue (B).

The touch zone 50 of the touch panel 100 proposed by the present embodiment includes a plurality of first conductive layers 51 extending along a first direction X, and a plurality of second conductive layers 52 extending along a second direction Y. One of the conductive layers is configured to let an input driving signal flows through, and the other conductive layer is configured to let a received detecting signal flows through. Each of the plurality of first conductive layers 51 includes a plurality of first driving electrodes 511 and a plurality of first driving lines 512 and meanwhile, each of the plurality of first driving lines 512 is connected to its adjacent first driving electrode 511. Each of the plurality of second conductive layers 52 includes a plurality of first sensing electrodes 521. During the touch detection, the mutual capacitatance change at the intersection of the first conductive layer 51 and the second conductive layer 52 or the self-capacitatance change of each of the plurality of conductive layers is detected; that is, the position of the touch point is obtained by self-capacitance or mutual capacitance. If the coordinate system is established in the first direction X and the second direction Y, the position of the obtained touch point can be demonstrated through the coordinate system. Generally, it is defined that the first direction X is perpendicular to the second direction Y and vice versa to make capacitance detection easier and coordinate positioning more convenient. In the present embodiment, the plurality of first driving electrodes 511 and the plurality of first sensing electrodes 521 are arranged in an array. The shape of each of the plurality of first driving electrodes 511 and the shape of each of the plurality of first sensing electrodes 521 may be a circle, a triangle, etc. If the touch panel 100 is of other shapes (like circular, irregular, or curve-shaped), the first direction X and the second direction Y may be intersected in a non-perpendicular arrangement.

Each of the plurality of first conductive layers 51 is connected to a corresponding transmission line 53. The controller 14 outputs a driving signal to each of the plurality of first conductive layers 51 through the transmission line 53. Each of the plurality of second conductive layers 52 is connected to a corresponding sensing line 54 to transmit a sensed sensing signal to the controller 14. The controller 14 periodically outputs a driving signal to each of the plurality of first conductive layers 51. Before the user touches the screen, the capacitance between the first conductive layer 51 and the second conductive layer 52 is a fixed value. When the user touches the screen (for example, when the user's finger touches the screen), the perceived capacitance between the first conductive layer 51 and the second conductive layer 52 which a point where the finger touches the screen corresponds to is influenced and changed by the human body, so the sensing signal returned by the second conductive layer 52 close to the touch point is different from other points away from the touched point. Therefore, the controller 14 can determine the point touched by the user's finger by detecting the change in the capacitance. Accordingly, the touch function realizes.

Figure 3A:
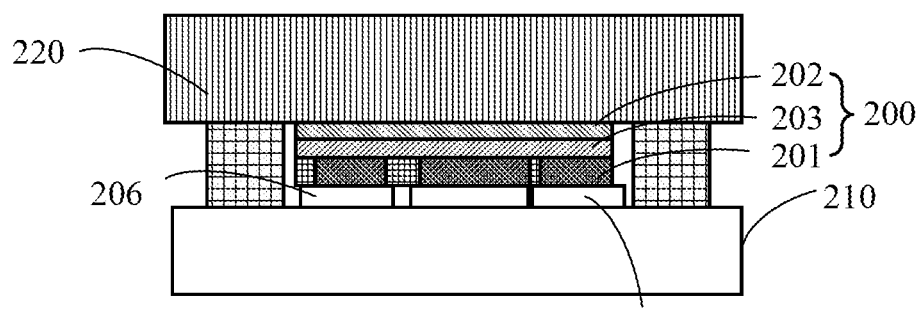
FIG. 3A is a schematic diagram of an OLED structure, a substrate, and an encapsulating layer.
Figure 3B:
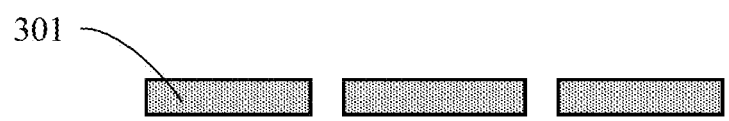
FIG. 3B is a schematic diagram illustrating etching a first conductive material with a first mask.
Figure 3B:
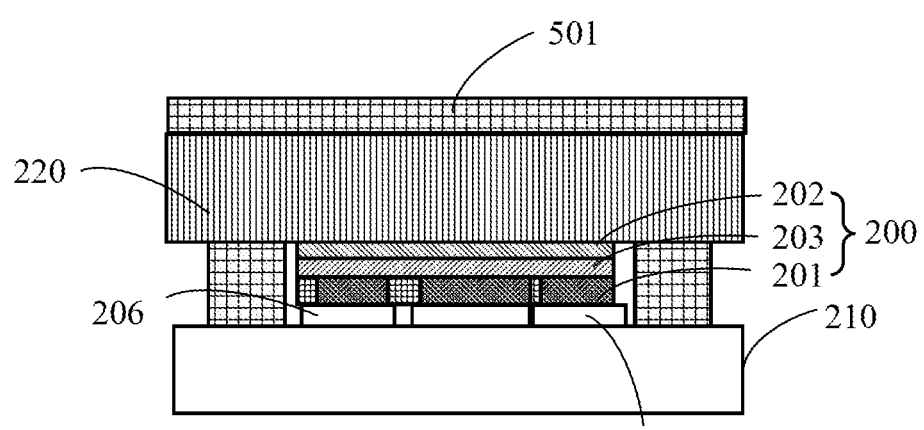

Please refer to FIG. 3A, FIGS. 4A-8A, and FIGS. 4B-8B. FIG. 3A is a schematic diagram of an OLED structure 200, a substrate 210, and an encapsulating layer 220. FIG. 3B is a schematic diagram illustrating etching a first conductive material 501 with a first mask 301. FIGS. 4A, 5A, 6A, 7A, and 8A illustrate the process of forming the touch panel 100 from a top view according to the first embodiment of the present disclosure. FIGS. 4B, 5B, 6B, 7B, and 8B illustrate the process of forming the touch panel 100 proposed by the first embodiment along a profile line C-C' as shown in FIGS. 4A, 5A, 6A, 7A, and 8A, respectively. As illustrated in FIG. 3A, the OLED structure 200 is formed on the substrate 210. The substrate 210 includes, but is not limited to, a glass substrate, a flexible substrate made of polyimide (PI), or the like. The OLED structure 200 includes an anode 201, a cathode 202, and an OLED layer 203. The organic light emitting diode layer 203 is arranged between the anode 201 and the cathode 202. A thin film transistor layer is arranged between the OLED structure 200 and the substrate 210. The thin film transistor layer includes a plurality of thin film transistors (TFTs) 206. The plurality of TFTs 206 are turned on and off in accordance with a control signal generated by the controller 14 to conduct the voltage generated by the controller 14 to the anode 201 and the cathode 202. The anode 201 and the cathode 202 generate light of different grayscales according to the voltage difference between the anode 201 and the cathode 202. Afterwards, an encapsulating layer 220 is formed on the OLED structure 200.

Figure 4A:
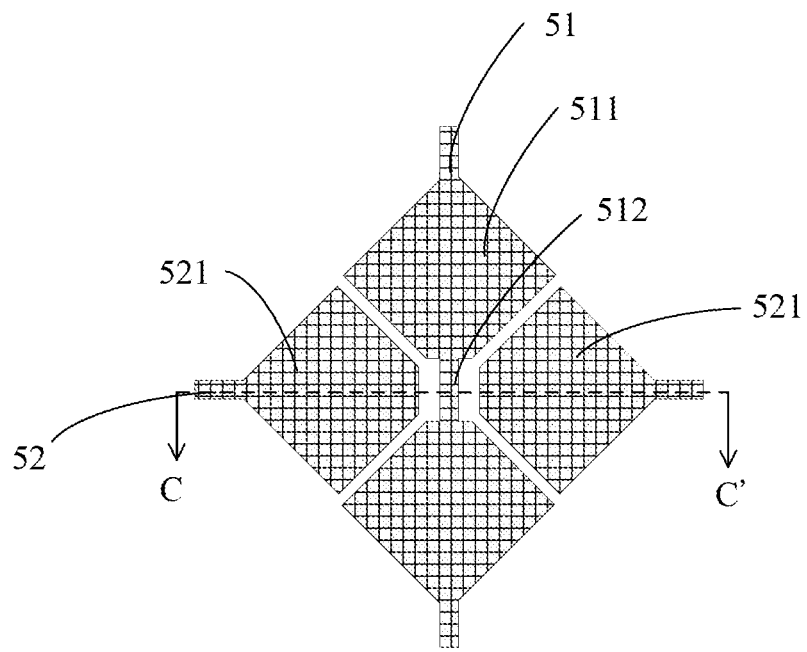
FIGS. 4A, 5A, 6A, 7A, and 8A illustrate the process of forming the touch panel from a top view according to the first embodiment of the present disclosure.
Figure 4B:
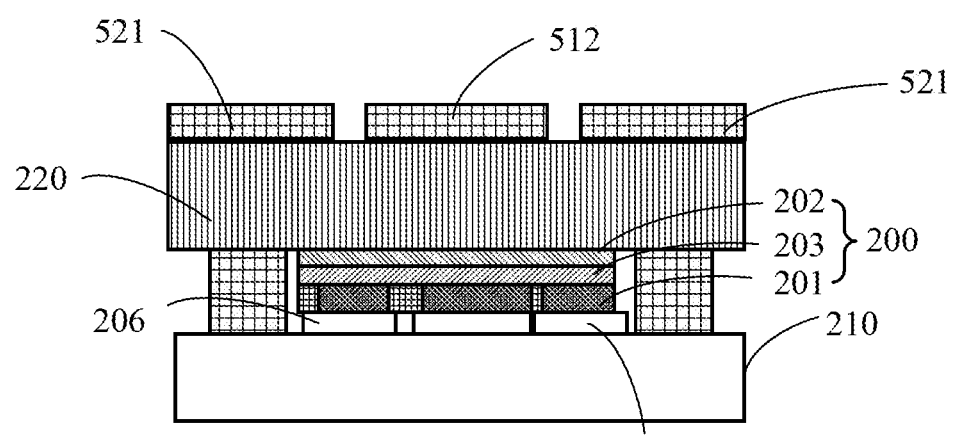
FIGS. 4B, 5B, 6B, 7B, and 8B illustrate the process of forming the touch panel proposed by the first embodiment along a profile line C-C' as shown in FIGS. 4A, 5A, 6A, 7A, and 8A, respectively.

Please refer to FIG. 3B, FIG. 4A, and FIG. 4B. A first conductive material 501 is deposited on the encapsulating layer 220. The first conductive material 501 is made from indium tin oxide or indium zinc oxide or silver nanowires (AgNW). The first conductive material 501 is etched with the first mask 301 to form the first conductive layer 51 and the second conductive layer 52 simultaneously. The first conductive layer 51 and the second conductive layer 52 are formed on the encapsulating layer 220. The first conductive layer 51 includes a plurality of first driving electrodes 511 and a first driving line 512 connecting two adjacent first driving electrodes 511. The second conductive layer 52 includes a plurality of first inductive independent electrodes 521 (i.e., a plurality of first sensing electrodes 521 are not connected).

Figure 5A:
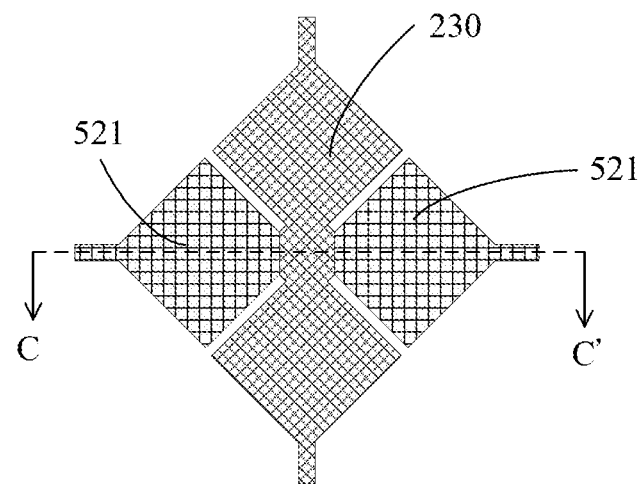
Figure 5B:
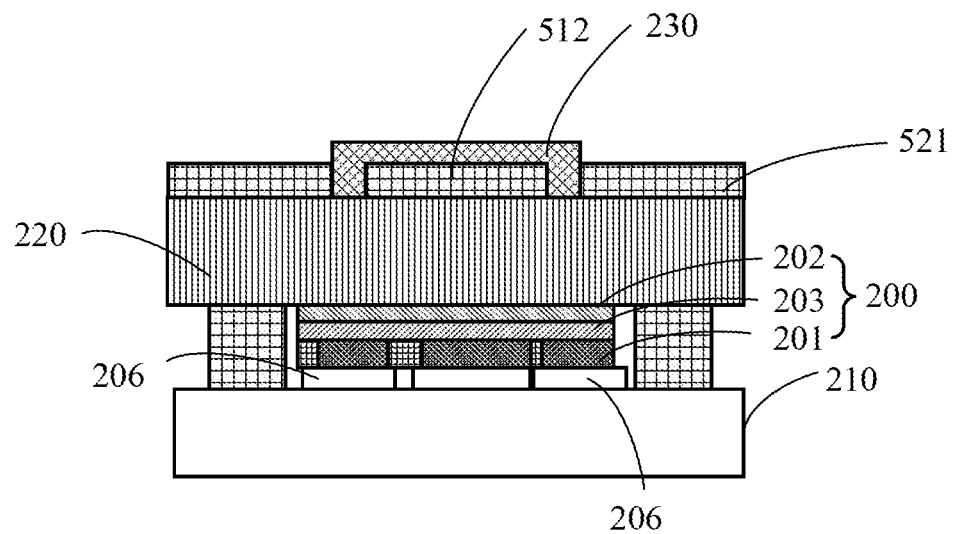

Please refer to FIGS. 5A and 5B. An insulating layer 230 is formed to cover the first conductive layer 51. The insulating layer 230 is configured to separate the first conductive layer 51 from the second conductive layer 52. Specifically, the insulating layer 230 includes, but is not limited to, an inorganic insulative material such as silicon nitride (SiNx) or an organic insulative material such as polyamide (polyamides, PA) and polymethyl methacrylate (PMMA). The insulating layer 230 is deposited on the first conductive layer 51 and the second conductive layer 52 and then etched to retain the insulating layer 230 overlapping and overlying the first conductive layer 51.

Figure 6A:
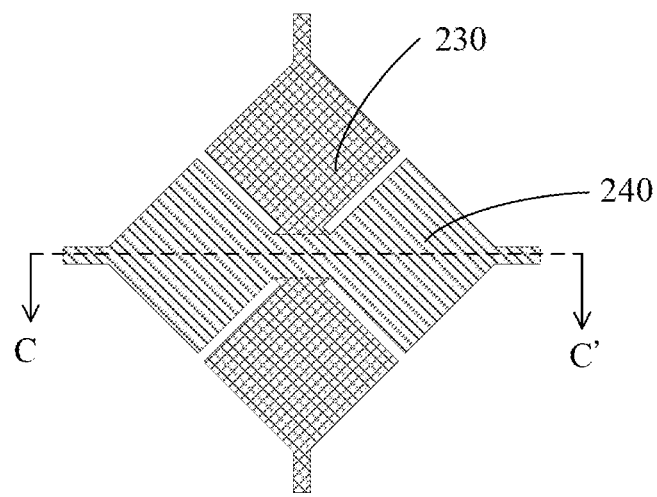
Figure 6B:
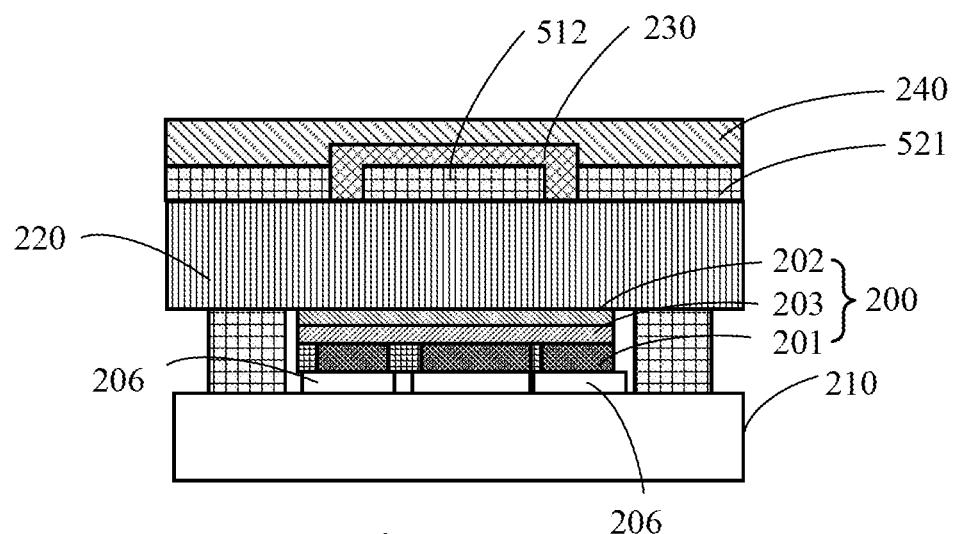

Please refer to FIGS. 6A and 6B. A sensing conductive layer 240 is formed on the insulating layer 230 and the second conductive layer 52 so that the sensing conductive layer 240 can contact the plurality of first sensing electrodes 521 directly. In another embodiment, a conductive material may be deposited on an encapsulating layer 220. The conductive material may be indium tin oxide or indium zinc oxide or silver nanowires (AgNW). The conductive material is etched with another mask to form the sensing conductive layer 240. The sensing conductive layer 240 not only overlaps the plurality of first sensing electrodes 521 but also forms an electrically connected bridge structure, so that the plurality of independent and disconnected first sensing electrodes 521 can be electrically connected through the sensing conductive layer 240.

Figure 7A:
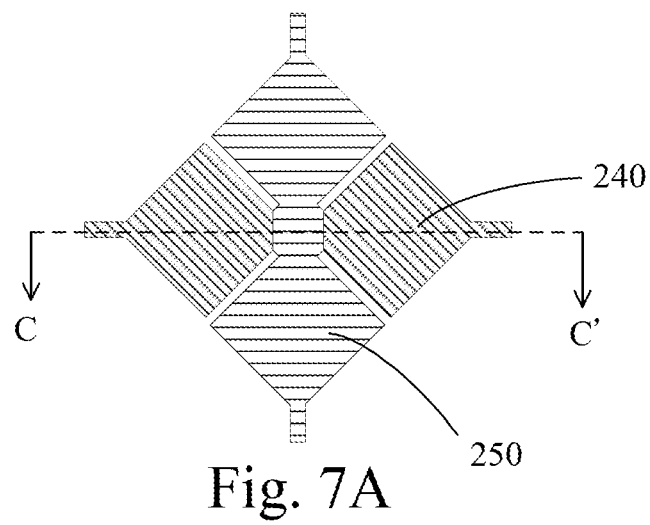
Figure 7B:
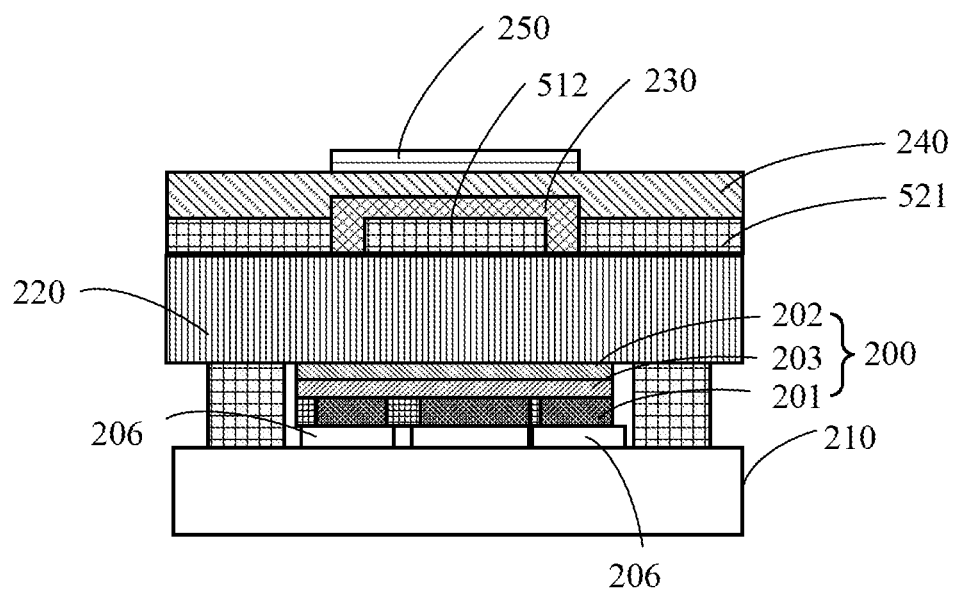

Please refer to FIGS. 7A and 7B. An isolating layer 250 is formed on the sensing conductive layer 240. The isolating layer 250 covers the first conductive layer 51. The isolating layer 250 includes, but is not limited to, an inorganic insulative material such as silicon nitride (SiNx) or an organic insulative material such as polyimide (Polyamides, PA), polymethyl methacrylate (PMMA), and soluble polytetrafluoroethylene (Polyfluoroalkoxy, PFA). The isolating layer 250 is deposited on the sensing conductive layer 240. Afterwards, the insulative material is etched with another mask to form the isolating layer 250. The isolating layer 250 covers the first conductive layer 51 only. It is notified that the isolating layer 250 overlaps the insulating layer 230. In another embodiment, the shape and area of the isolating layer 250 is substantially equal to an insulating layer 230 from a top view.

Figure 8A:
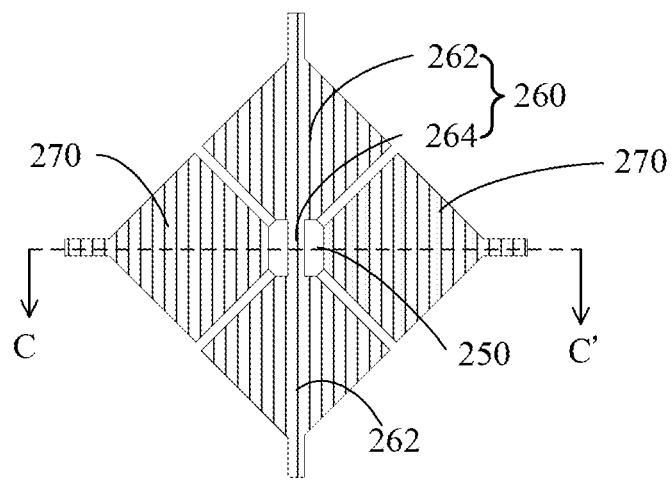
Figure 8B:
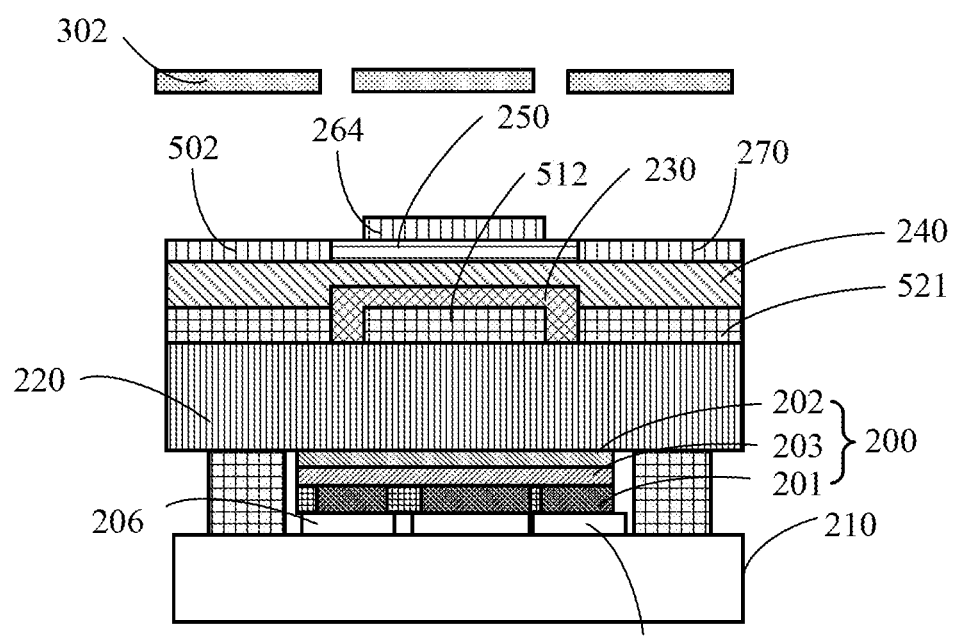

Please refer to FIGS. 8A and 8B. A second conductive material 502 is deposited on the sensing conductive layer 240 and the isolating layer 250. Afterwards, the second conductive material 502 is etched with a second mask 302 to form a third conductive layer 260 and a plurality of second sensing electrodes 270. In another embodiment, a second conductive material 502 can be a metal mesh. A third conductive layer 260 includes a plurality of second driving electrodes 262 and a second driving line 264 connecting to an adjacent second driving electrodes 262. The third conductive layer 260 and the sensing conductive layer 240 are separated by the isolating layer 250. The first conductive layer 51 is electrically connected to the third conductive layer 260. The plurality of second sensing electrodes 270 overlap the plurality of first sensing electrodes 521 one-on-one.

Please refer to FIG. 1, FIG. 8A, and FIG. 8B. The third conductive layer 260 and the first conductive layer 51 overlap and are electrically connected to each other (illustrated in FIG. 1), so the third conductive layer 260 and the first conductive layer 51 have the same voltage level. That is to say, both of the third conductive layer 260 and the first conductive layer 51 can be regarded as having the same detection effect. In addition, because of the electric field between the first conductive layer 51 and the cathode 202 of the OLED structure 200, the influence of the cathode 202 of the OLED structure 200 on the driving signal transmitted through the third conductive layer 260 can be effectively reduced, thereby increasing the mutual capacitance of the third conductive layer 260 and the plurality of second sensing electrodes 270 and improving the touch precision. In addition, the sensing conductive layer 240 overlaps and contacts the plurality of first sensing electrodes 521 directly. Therefore, the contacted area of the sensing conductive layer 240 and the plurality of first sensing electrodes 521 is larger, resulting in a decrease in resistance as well as a reduction in power consumption.

Please refer to FIGS. 4A-5A, FIGS. 9A-10A FIGS. 4B-5B, and FIGS. 9B-10B. FIGS. 4A-5A and FIGS. 9A-10A respectively illustrate the process of forming a touch panel 100 from a top view according to a second embodiment of the present disclosure. FIGS. 4B-5B and FIGS. 9B-10B illustrate the process of forming the touch panel 100 proposed by the second embodiment along a profile line C-C' as shown in FIGS. 4A-5A and FIGS.

9A-10A, respectively. Since the blocks and structures of the touch panel 100 proposed by the second embodiment are the same as the blocks and structures of the touch panel 100 proposed by the first embodiment as illustrated in FIGS. 4A-5A and FIGS. 4B-5B, the details are not described herein.

Figure 9A:
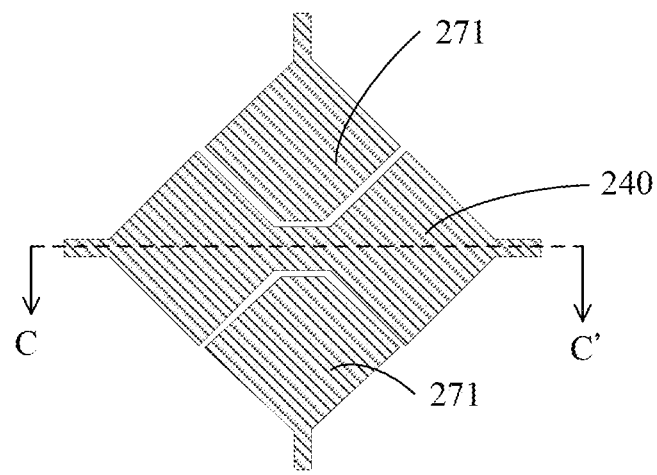
Figure 9B:
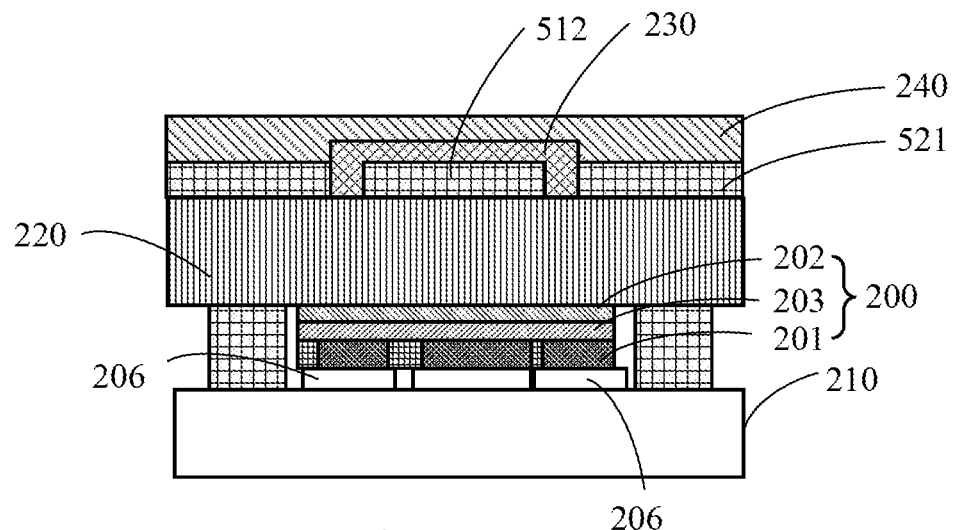

Please refer to FIGS. 9A and 9B. A sensing conductive layer 240 and a plurality of third driving electrodes 271 are formed on an insulating layer 230 and a second conductive layer 52 such that the sensing conductive layer 240 directly contacts a plurality of first sensing electrodes 521. A plurality of third driving electrodes 271 are independent and are not connected to each other. Each of the third driving electrodes 271 is not electrically connected to the sensing conductive layer 240. In another embodiment, a conductive material may be deposited on an encapsulating layer 220. The conductive material may be indium tin oxide or indium zinc oxide or silver nanowires (AgNW). The conductive material is etched using another mask to form the sensing conductive layer 240 and the plurality of third driving electrodes 271 simultaneously. The sensing conductive layer 240 not only overlaps the plurality of first sensing electrodes 521 but also forms an electrically connected bridge structure so that the plurality of independent and disconnected first sensing electrodes 521 are electrically connected through the sensing conductive layer 240.

Figure 10A:
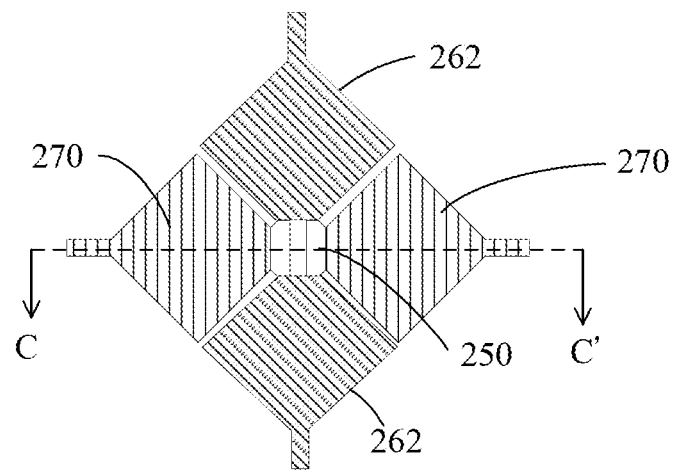
Figure 10B:
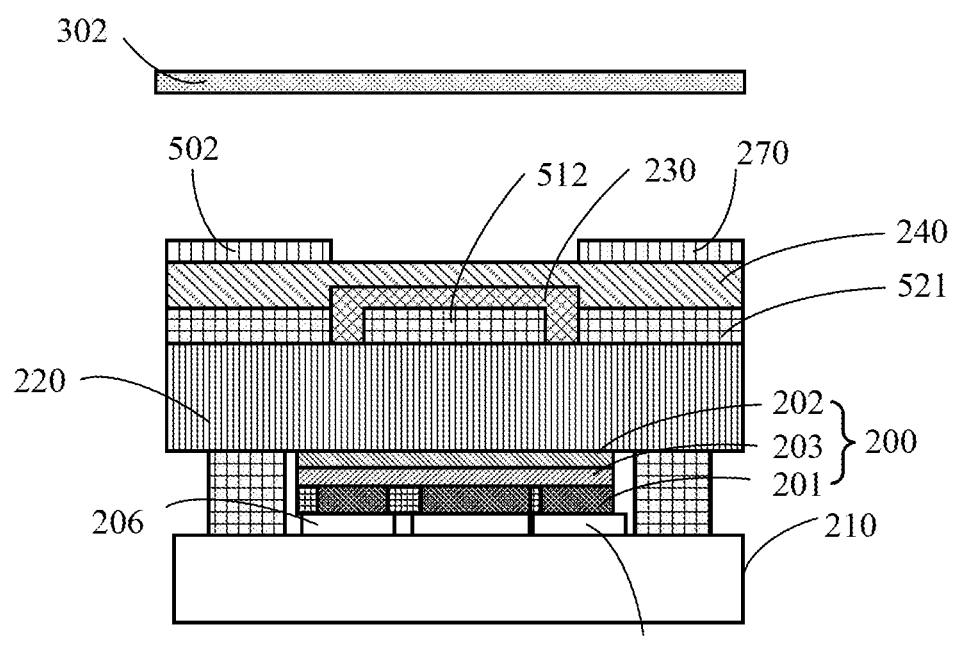

Please refer to FIGS. 10A and 10B. A second conductive material 502 is deposited on the sensing conductive layer 240 and a plurality of third driving electrodes 271. Afterwards, the second conductive material 502 is etched with the second mask 302 to form a third conductive layer 260 and a plurality of second sensing electrodes 270. In another embodiment, a second conductive material 502 can be a metal mesh. A third conductive layer 260 includes a plurality of second driving electrodes 262. The plurality of second driving electrodes 262 overlap a plurality of third driving electrodes 271 one-on-one. A first conductive layer 51 is electrically connected to the third conductive layer 260. The plurality of second sensing electrodes 270 overlap a plurality of first sensing electrodes 521.

Please refer to FIG. 2, FIG. 10A, and FIG. 10B. The sensing conductive layer 240 overlaps and contacts the plurality of first sensing electrodes 521 directly so that the contacted area of the sensing conductive layer 240 and the plurality of first sensing electrodes 521 is larger, resulting in smaller resistance extending along the direction to the first sensing electrode 521 as well as less power consumption. Similarly, the plurality of second driving electrodes 262 contacts the plurality of third driving electrodes 271, resulting in a decrease in resistance extending along the direction to the first driving electrodes 511 and a decrease in power consumption.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic light-emitting diode (OLED) touch panel, comprising:
   a substrate;
   an OLED structure, arranged on the substrate;
   an encapsulating layer, arranged on the OLED structure;
   wherein the OLED touch panel further comprises:
   a first conductive layer, arranged on the encapsulating layer, and comprising a plurality of first driving electrodes;
   a second conductive layer, arranged on the encapsulating layer, and comprising a plurality of first sensing electrodes;
   an insulating layer, covering the first conductive layer and configured to separate the first conductive layer from the second conductive layer;
   a sensing conductive layer, arranged on the insulating layer and contacting the plurality of first sensing electrodes;
   a third conductive layer, comprising a plurality of second driving electrodes; and
   a plurality of second sensing electrodes, arranged on the sensing conductive layer; the plurality of second sensing electrodes overlapping the plurality of first sensing electrodes one-on-one.

2. The OLED touch panel of claim 1, wherein the first conductive layer is indium tin oxide or indium zinc oxide or silver nanowires (AgNW).

3. The OLED touch panel of claim 1, wherein the plurality of second sensing electrodes and the third conductive layer are simultaneously formed by a second conductive material.

4. The OLED touch panel of claim 3, wherein the second conductive material is a metal mesh.

5. The OLED touch panel of claim 1, wherein the OLED touch panel further comprises an isolating layer; the isolating layer is arranged on the sensing conductive layer and covers the first conductive layer; the isolating layer overlaps the insulating layer.

6. The OLED touch panel of claim 5, wherein the third conductive layer further comprises a second driving line adjacent to the second driving electrodes.

7. A method of forming an organic light-emitting diode (OLED) touch panel, comprising:
   forming an OLED structure on a substrate, the OLED structure comprising an anode, a cathode, and an OLED layer; arranging the OLED layer between the anode and the cathode;
   forming an encapsulating layer on the OLED structure;
   forming a first conductive layer and a second conductive layer on the encapsulating layer; the first conductive layer comprising a plurality of first driving electrodes; the second conductive layer comprising a plurality of first sensing electrodes;
   forming an insulating layer to cover the first conductive layer; the insulating layer configured to separate the first conductive layer from the second conductive layer;
   forming a sensing conductive layer on the insulating layer; the sensing conductive layer contacting the plurality of first sensing electrodes;
   forming a third conductive layer and a plurality of second sensing electrodes on the sensing conductive layer, wherein the third conductive layer comprises a plurality of second driving electrodes; the plurality of second sensing electrodes overlapping the plurality of first sensing electrodes one-on-one.

8. The method of claim 7, further comprising: forming an isolating layer on the sensing conductive layer such that the isolating layer covers the first conductive layer; the third conductive layer and the sensing conductive layer are separated by the isolating layer.

9. The method of claim 7, wherein a step of forming the sensing conductive layer on the insulating layer comprises:
   forming the sensing conductive layer and a plurality of third driving electrodes on the insulating layer simultaneously; forming the plurality of third driving electrodes and the sensing conductive layer simultaneously with the same conductive material; the plurality of third driving electrodes being not connected to each other nor to the sensing conductive layer.

10. The method of claim 7, wherein the first conductive layer is indium tin oxide or indium zinc oxide or silver nanowires (AgNW).

11. The method of claim 7, wherein the plurality of second sensing electrodes and the third conductive layer are simultaneously formed by a second conductive material.

12. The method of claim 11, wherein the second conductive material is a metal mesh.

* * * * *